United States Patent
Erdmann (12)

(10) Patent No.: US 6,491,204 B1
(45) Date of Patent: Dec. 10, 2002

(54) STENCIL WIPING DEVICE

(76) Inventor: Gunter Erdmann, 18 Ponderosa La., E. Walpole, MA (US) 02032

( * ) Notice: Subject to any disclaimer, the term of this patent is extended or adjusted under 35 U.S.C. 154(b) by 142 days.

(21) Appl. No.: 09/721,282

(22) Filed: Nov. 22, 2000

Related U.S. Application Data

(60) Provisional application No. 60/168,046, filed on Nov. 30, 1999.

(51) Int. Cl.⁷ .............................. B23K 1/00; B60S 1/04
(52) U.S. Cl. .......................... 228/22; 15/97.1; 15/102; 15/256.5
(58) Field of Search .............................. 228/201, 248.1, 228/248.5, 19, 22, 23; 15/306.1, 303, 308, 97.1, 102, 246, 256.5

(56) References Cited

U.S. PATENT DOCUMENTS

| | | | | |
|---|---|---|---|---|
| 3,878,578 A | * | 4/1975 | Skudrna | 15/100 |
| 4,218,131 A | * | 8/1980 | Ito et al. | 15/256.5 |
| 5,226,199 A | * | 7/1993 | Jacoby | 15/246 |
| 5,455,665 A | * | 10/1995 | Baba et al. | 15/256.5 |
| 5,491,871 A | * | 2/1996 | Reber et al. | 15/308 |
| 5,586,715 A | * | 12/1996 | Schwiebert et al. | 164/129 |
| 5,660,632 A | * | 8/1997 | Volpe et al. | 101/114 |
| 5,782,399 A | * | 7/1998 | Lapastora | 156/556 |
| 5,901,405 A | * | 5/1999 | Tani | 101/423 |
| 5,976,269 A | * | 11/1999 | Hamasaki et al. | 101/423 |
| 5,991,963 A | * | 11/1999 | Tourigny | 101/423 |
| 6,036,787 A | * | 3/2000 | Bennett et al. | 101/423 |
| 6,112,975 A | * | 9/2000 | Lapastora | 228/180.1 |
| 6,199,243 B1 | * | 3/2001 | Tani | 101/425 |
| 6,237,484 B1 | * | 5/2001 | Homma et al. | 101/114 |
| 6,237,490 B1 | * | 5/2001 | Takahashi et al. | 101/123 |
| 6,267,818 B1 | * | 7/2001 | Volpe, Jr. | 101/123 |
| 6,395,335 B2 | * | 5/2002 | Onishi et al. | 101/129 |

FOREIGN PATENT DOCUMENTS

| | | | |
|---|---|---|---|
| JP | 403263734 A | * | 11/1991 |
| JP | 405042669 A | * | 2/1993 |
| JP | 405200992 A | * | 8/1993 |

OTHER PUBLICATIONS

US2001/0038882A1 Onishi et al. (Nov. 8, 2001).*
US 2001/0017086A1 Takahashi et al. (Aug. 20, 2001).*

* cited by examiner

*Primary Examiner*—M. Alexandra Elve
*Assistant Examiner*—Kiley Stoner
(74) *Attorney, Agent, or Firm*—Barlow, Josephs & Holmes, Ltd.

(57) ABSTRACT

A cleaning apparatus for cleaning solder paste off the bottom side of a printed circuit board stencil includes a container of cleaning solution therein and a blade holder that is movable between a wiping position and the container of cleaning solution. A wiping blade is mounted in the blade holder. The blade holder, with the blade mounted thereon, is reciprocated back and forth when in communication With a stencil to be cleaned. The blade is moved from the wiping position in communication with the stencil into the cleaning solution in the container. A pneumatic piston and rotary actuator provides controlled movement of the wiping blade. The wiping blade may be vibrated during wiping to improve removal of solder paste from the stencil and the cleaning solution may be ultrasonically vibrated to improve removal of solder paste from the wiping blade. The wiping blade may also be pulsed into a sponge to remove excess cleaning solution prior to the next cleaning cycle. After cleaning, the cleaning solution may be filtered and reused in a closed loop method.

17 Claims, 8 Drawing Sheets

STENCIL WIPING DEVICE

This application claims benefit of provisional application Ser. No. 60/168,046 field Nov. 30, 1999.

BACKGROUND OF THE INVENTION

The present invention relates generally to a stencil wiping device. More specifically, the present invention relates to devices for cleaning excess solder paste from the bottom (contact) side of printed circuit board stencils.

In the manufacture of a circuit boards, conductive ink or solder paste is selectively printed on a substrate such as a ceramic substrate or a fiberglass circuit board. A metal or plastic stencil is often used for this printing operation and particularly where solder bumps are printed on the substrate. In prior operations of this type, the circuit board to receive solder bumps is placed on a vacuum printing nest. The nest is attached to a slide which, following alignment, is shuttled under a metal stencil which is preferably made of brass or stainless steel. Once under the stencil, the stencil moves down to make contact with the circuit board and solder paste is deposited on the stencil and is squeezed through the holes in the stencil by a squeegee which is moved across the upper face of the stencil. When the printing is complete, the stencil is lifted off of the circuit board, and the circuit board, nest and slide, being connected together, are shuttled back to an operator where the circuit board is removed and the process is repeated.

However, excessive solder often gathers on the edges of the holes of the stencil and impedes the flow of solder to the circuit board. Further, solder paste or conductive ink may wick along the bottom face of the stencil adjacent the hole formed therein. This results in smudged conductive lines or solder paste upon subsequent printing and may even result in unintentional shorting between circuit pads. Further, the solder bumps printed in this manner are notably deformed and hence are not of uniform quality from board to board. This may cause further problems when a semiconductor device, such as an integrated flip-chip, is connected and secured to the solder deposition.

Operators have been known to manually wipe the bottom of the solder paste stencil to remove excess solder paste. However, this is not sufficient to dislodge solder gathered in the holes of the stencil. Further, manual removal of excessive solder paste is messy, labor and time intensive, and not always reliable.

There have been many attempts in the prior art to address the foregoing concerns. For example, FIG. 1 shows a prior art apparatus 2 for wiping the bottom surface of a stencil 14. A lint-free cleaning sheet 1 is fed from a supply roll 3 and through a set of tensioning rollers 5. Solvent is applied to the sheet 1 by a solvent bar 11. The solvent is pumped into the solvent bar 11 by a pump (not shown) and the liquid from the solvent bar 11 through porous walls onto the sheet 1. The sheet 1 passes over a pair of flexible blades 13 which press the sheet 1 against the stencil 14. A vacuum channel 15 supports the blades 13.

Suction is optionally applied to the vacuum channel 15 to pull the stencil 14 tightly against the sheet 1 as vacuum is applied from the channel 15 through an outlet tube 17. The sheet 1 then passes through a second set of tensioning rollers 19 and is taken up on a take-up roll 21. Cross members 16 are disposed across the width of the vacuum channel 15.

FIG. 2 shows a top view of the blades 13 and vacuum channel 15 shown in prior art FIG. 1. The cross section of FIG. 1 is taken along line A in FIG. 2. A number of cross members 16 are disposed across the vacuum channel 15.

To wipe the stencil 14 the sheet 1 is advanced past the solvent bar 11 to apply solvent to the portion of the sheet 1 which will be positioned between the blades 13 and the stencil 14. The apparatus 2 is then moved as shown by arrows 23 so that the blades 13; wipe the solvent-laden sheet 1 across the stencil 14. Optionally, suction applied via the vacuum channel 15 increases the force between the sheet 1 and the stencil 14.

The use of solvent in the above apparatus facilitates the removal of debris, particularly dried solder paste. Without the use of the solvent, wiping using the above apparatus is unreliable. The use of solvents, however, presents a number of problems in the manufacturing process. Many solvents contribute to environmental pollution and are hazardous to workers. Certain solvent vapors can cause smog or contribute to ozone destruction in the upper atmosphere. Many solvents are toxic and/or highly flammable. As such, their use is heavily regulated and regulatory compliance increases the cost of manufacturing circuit boards. Less hazardous solvents are available but they are expensive and less effective in removing dried solder paste. The paper rolls are contaminated with solder paste that has a high lead content. Disposal of such waste is very costly due to government regulations.

The prior art apparatus described with reference to FIG. 1 can be used without applying a solvent to the sheet. The result, however, is that cleaning of the stencil is less effective and a greater number of unreliable solder joints and shorts are formed on the finished printed circuit board.

The amount of solvent that is required for the process can be reduced with acceptable reliability if workers periodically wipe the stencil by hand using a solvent soaked cloth instead of applying solvent to the automated wiping apparatus shown in prior art FIG. 1. This procedure presents other difficulties, however. Hand wiping presents a health risk to workers by increasing their exposure to metals, particularly lead, in the solder paste. In addition, hand wiping requires that the automated machinery be stopped so that a worker can reach into the apparatus. Stopping the screen printer to wipe the stencil may result in idling equipment used in subsequent processing steps thus decreasing the productivity of the production line.

In view of the foregoing, there is a need for an automated, reliable method of cleaning solder paste and conductive ink stencils and removing solder paste or ink gathered in the apertures and, in particular, on the bottom side on the edges of the apertures of the stencil. There is also a demand for a stencil wiping device that is less costly to operate that prior art paper roll-based cleaning stencil cleaning systems. Further, there is a demand for a stencil wiping device that is fast in order to reduce down time of the stencil while providing superior solder paste removal. There is still a further demand for a stencil wiping device to enable the reclaiming of removed solder paste for recycling thereof.

SUMMARY OF THE INVENTION

The present invention preserves the advantages of prior art devices for cleaning solder paste from printed circuit board stencils. In addition, it provides new advantages not found such currently available cleaning devices and overcomes many disadvantages of such currently available devices.

The stencil cleaning apparatus, in accordance with the present invention, includes a container of cleaning solution therein and a blade holder that is movable between a wiping position and the container of cleaning solution. A wiping blade or multiple blades are mounted in the blade holder. The blade holder, with the blade mounted thereon, is reciprocated back and forth when in communication with a stencil to be cleaned. The blade is moved from the wiping position in communication with the stencil into the cleaning solution in the container. A pneumatic piston and rotary actuator provides controlled movement of the wiping blade. The wiping blade may be vibrated during wiping to improve removal of solder paste from the stencil and the cleaning solution may be ultrasonically vibrated at high frequency to improve removal of solder paste from the wiping blade. The wiping blade may also be pulsed into a sponge to remove cleaning excess solution and semi-dry the blades prior to the next cleaning cycle.

In accordance with the method of the present invention, a cleaning bath of cleaning solution and a wiping blade are provided. The wiping blade is reciprocating while it is in contact with a stencil to remove excess solder paste therefrom. The wiping blade is then rotated 180 degrees into a cleaning bath which is, preferably ultrasonically vibrated, to remove the collected excess solder paste from the stencil. The clean wiping blade is removed from the cleaning bath and is then, preferably, pulsed into a sponge to remove any excess cleaning solution remaining on the wiping blade. An air tube may also be provided to blow air through the stencil from the top and into communication with the wiping blade to improve solder paste removal as well as containing solder paste particles that were airborne.

It is therefore an object of the present to provide a stencil wiping device that is more efficient and faster than prior art stencil cleaning devices.

Another object of the present invention is to provide a stencil wiping device that is less expensive to operate than prior art stencil cleaning devices.

It is a further object of the present invention to provide a stencil wiping device that can effectively re-claim solder paste cleaned from the bottom side of a printed circuit board stencil.

It is a further object of the present invention to provide a stencil wiping device that is 100 percent effective.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
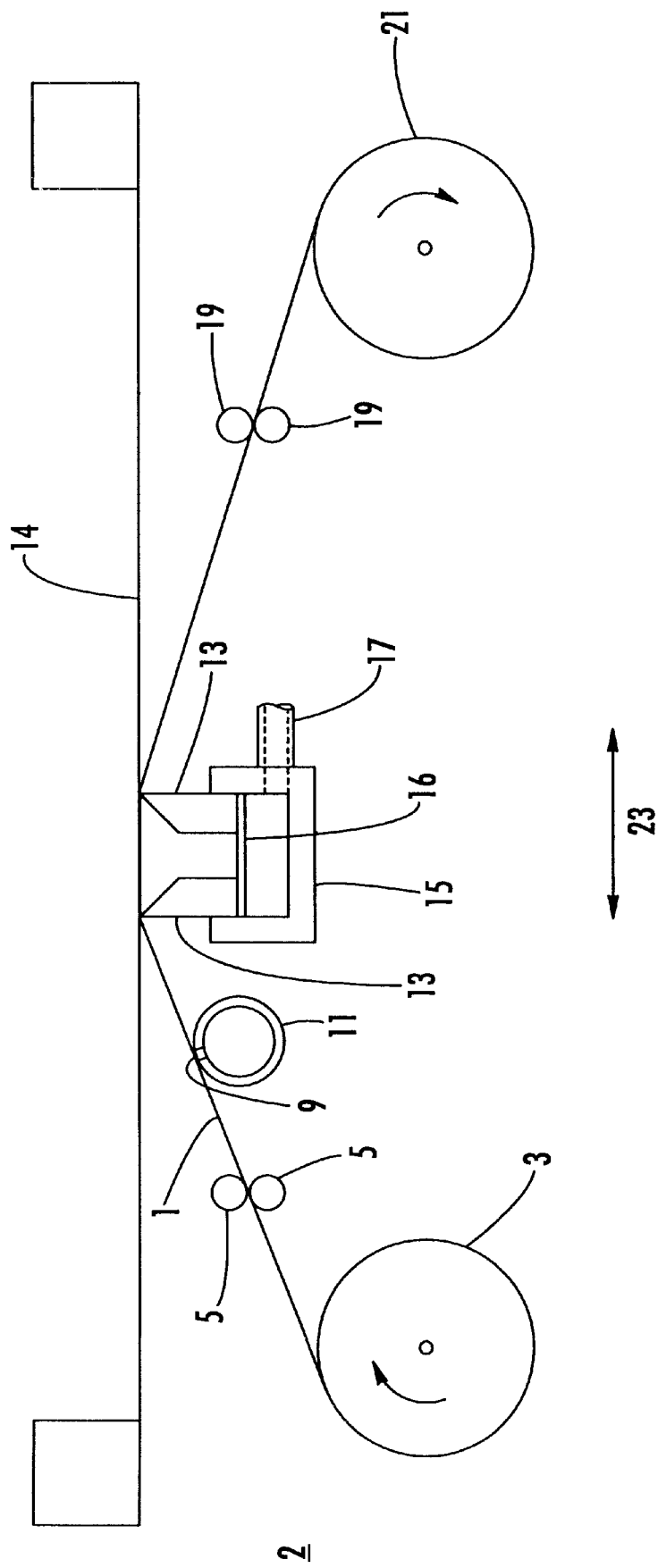
FIG. 1 shows a prior art apparatus for wiping the bottom surface of a stencil.
Figure 2:
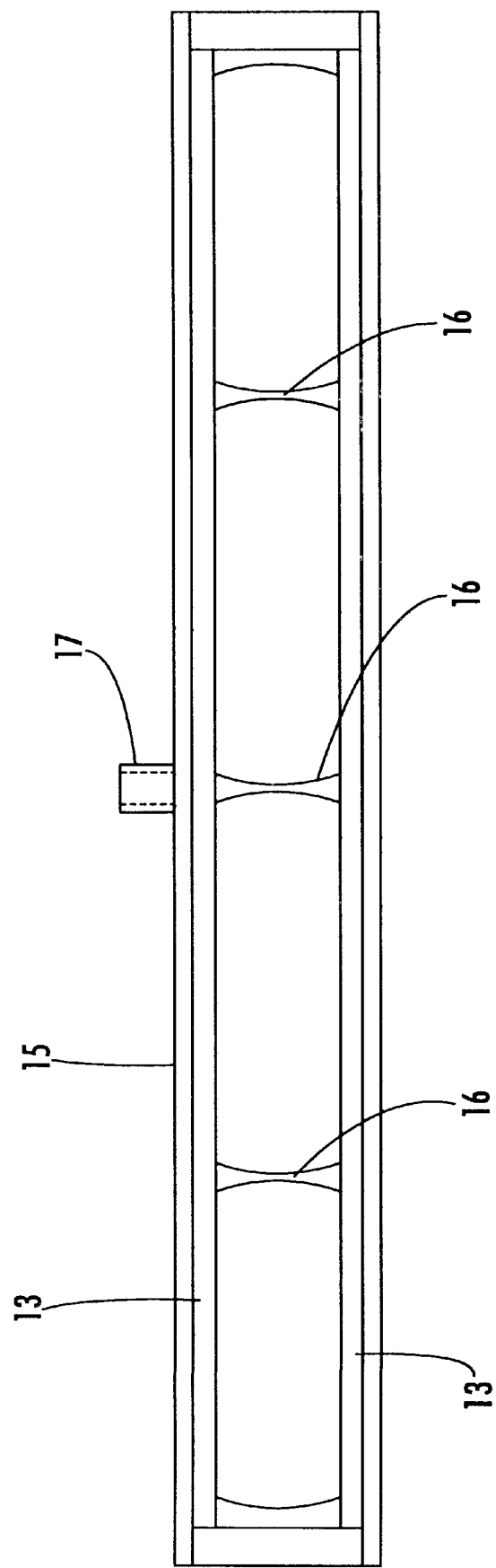
FIG. 2 shows a top view of the blades and vacuum channel shown in the prior art device of FIG. 1.
Figure 3:
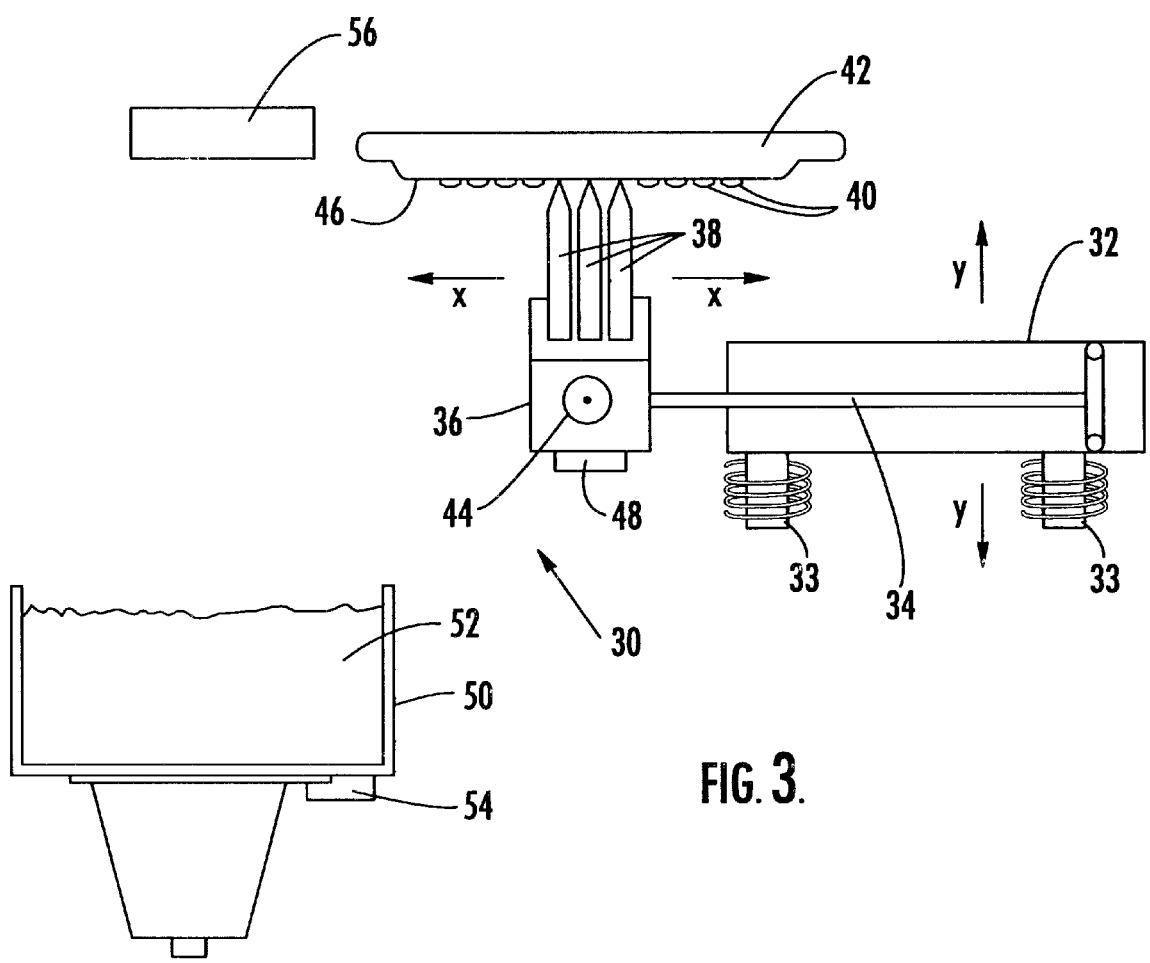
FIG. 3 is a side elevational view of the stencil wiping device of in accordance with the present invention in the process of wiping a stencil.
Figure 9:
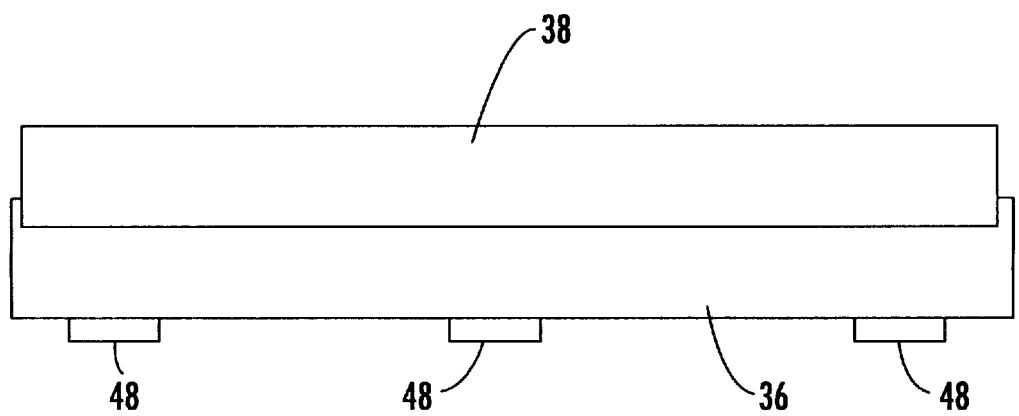
FIG. 9 is a front view of the blades installed in the blade holder in accordance with the present invention.

FIGS. 1 and 2 illustrates a prior art stencil cleaning device 2 which is described in detail above. FIGS. 3–7 show the stencil wiping device 30 in accordance with the present invention. Referring first to FIG. 3, the stencil wiping device 30 includes a pneumatic cylinder 32 with a reciprocatable piston 34 that supports a blade holder 36. Preferably, three blades 38 are mounted into the blade holder 36. However, more or less than three blades 38 may be employed depending on the specific application at hand. The blades 38 are, preferably, made of rubber to be resilient and long wearing while still being effective in wiping solder paste 40 from a stencil 42. The blades may be made of other materials, such as plastic. As shown in FIG. 9, a front view of the blades 38 installed in the blade holder 36 is shown to illustrate the length of the blades 38. Preferably, the blades 38 are approximately 4–24 inches long and approximately 1¼ inch high but may be of any desired length and height to accommodate the given stencil 42 to be cleaned. Also, each of the blades 38 are preferably of a thickness of approximately ⅛ of an inch to approximately ¼ of an inch to accommodate most printed circuit board stencils 42.

Figure 6:
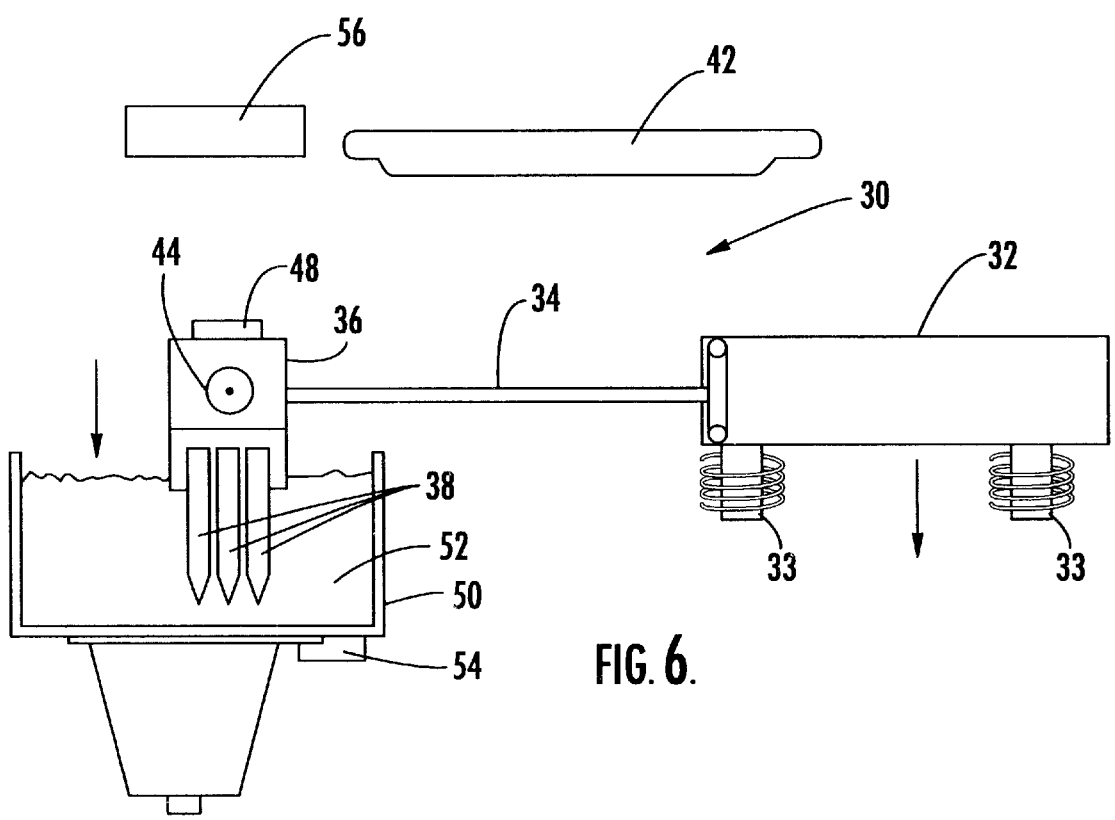
FIG. 6 is a side elevational view of the stencil wiping device of FIG. 3 with wiping blades submerged in an ultrasonic bath for cleaning.
Figure 7:
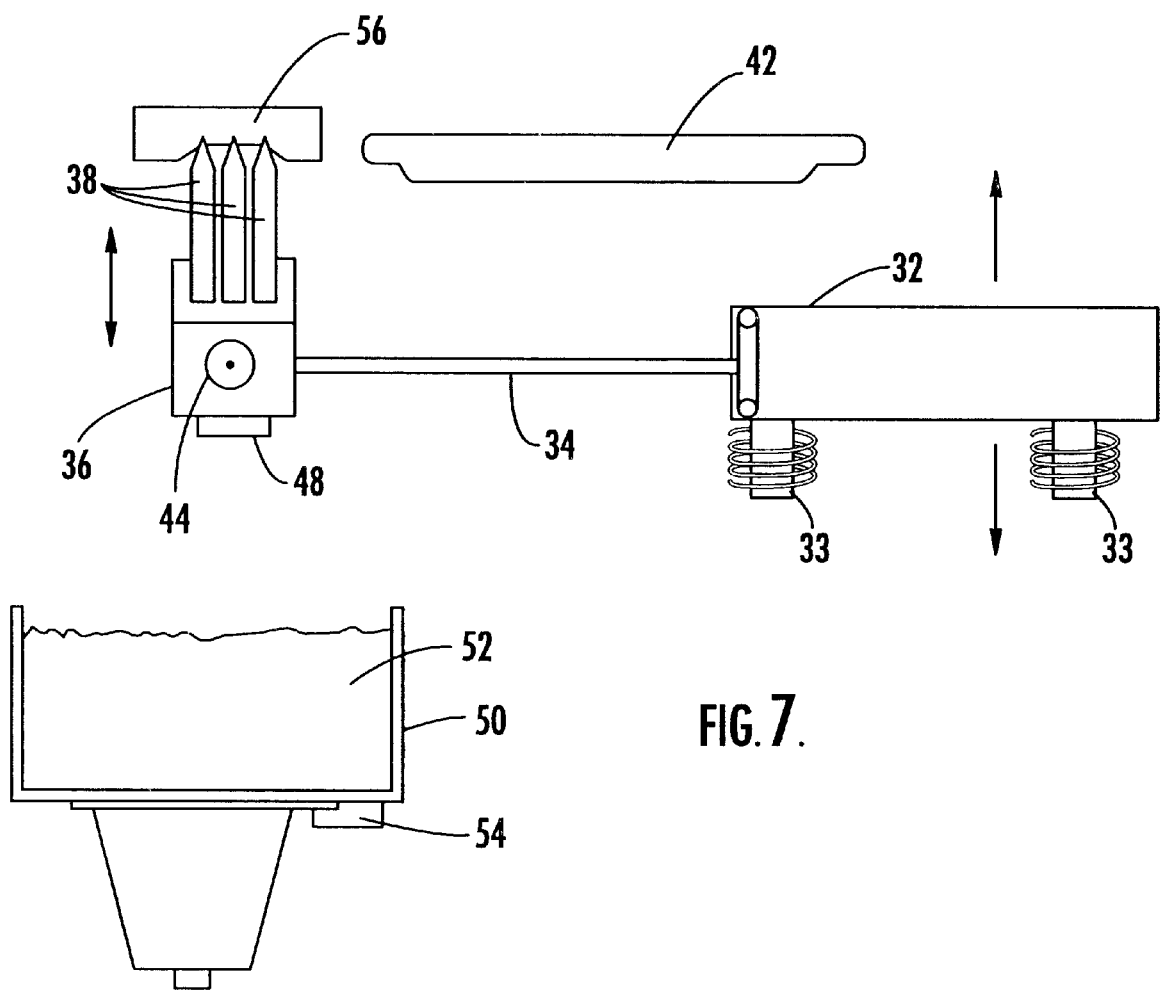
FIG. 7 is a side elevational view of the stencil wiping device of FIG. 3 being pulsated into a sponge to remove excess cleaning solution in preparation for a new wiping cycle.

The piston rod 34 is slidably mounted in the cylinder 32 which is connected to an air source in order to push the blade holder 36 forward and backward. Alternatively, the blade holder may be pushed back and forth by other mechanisms, such as a linear bearing that is driven by a number of belts from one motor (not shown). As a result, the blades 38 in the blade holder 36 are reciprocatable in a horizontal direction indicated by the arrows referenced as X. The cylinder 32 itself is also reciprocatable in a vertical direction as indicated by the arrows referenced as Y by up/down pistons 33. The blade holder 36 is rotatably mounted on a rotary actuator 44 so that the blades 38 can be rotated from a wiping position, as shown in FIG. 3, to a cleaning position as shown in FIG. 6, to a cleaning removal position shown in FIG. 7. FIGS. 3 and 7 will be discussed in detail below. As a result, the location and positioning of the blades 38 may be controlled within the device of the present invention. By this arrangement, as will be described below, the blades 38 are capable of being moved to a cleaning bath for removal of wiped solder paste 40 and to a cleaning solution removal position.

It should be understood that the employment of a pneumatic cylinder 32, piston 34 and rotary actuator 44 are just one of many structural methods to move the wiping blades 38 of the present invention from a wiping position to cleaning bath position to a cleaning solution removal position, Other methods, such as the use of linkages and gears, may be employed and still be within the scope of the present invention. A hydraulic cylinder may be used instead of the pneumatic cylinder 32. Further, the location of the relative wiping, solder paste removal and cleaning solution removal positions may vary from application to application thus necessitating variations in the angles of rotations and extent of translation of the blade holder 36 with blades 38 installed therein. All such variations are deemed to be within the scope of the present invention.

In FIG. 3, a stencil 42 is shown whereby excess solder paste 40 is located on the bottom surface 46 thereof. As described above, there is a need to efficiently and effectively removed this excess solder paste 40 that has collected. The cylinder 32 is actuated vertically into an upward position so that the blade holder 36, via the piston 34, urges the blades 38 into communication with the bottom surface 46 of the stencil to be cleaned. As indicated by arrows X, the blades 38 are reciprocated back and forth. Preferably, as indicated above, a set of three blades 38 are installed in the blade holder 36 and are positioned substantially parallel to one another. As a result of the use of three blades 38, the number of passes across the bottom surface 46 of the stencil 42 can be reduced. For example, it has been discovered that a single pass to the left and then a single pass to the right is sufficient to remove the collected solder paste 40. Depending on the stencil 42 and the amount and type of solder paste material, a single pass may be all that is necessary, or more than two passes may be necessary. As shown in FIG. 3, the blades 38 are drawn back and forth across the bottom surface 46 of the stencil 42 to lift off the solder paste 40 that has collected on the bottom surface 46 thereof. A vibratory mechanism 48 may also be connected to the blade holder 36 to vibrate the blades 38 during wiping in a zig zag motion to improve removal of solder paste 40 from the stencil 42.

Figure 4:
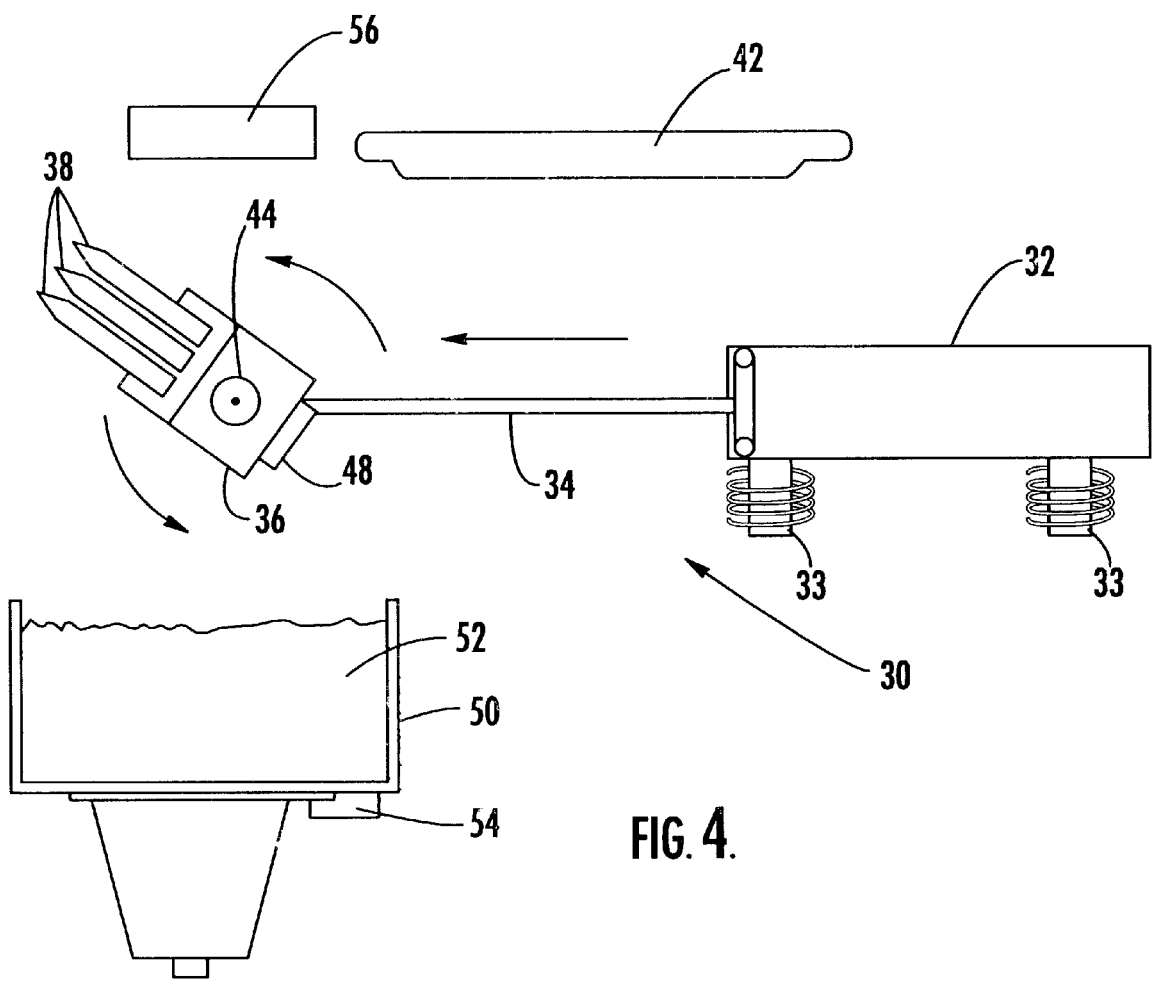
FIG. 4 is a side elevational view of the stencil wiping device of FIG. 3 with blades being rotated 180 degrees to the cleaning bath.
Figure 5:
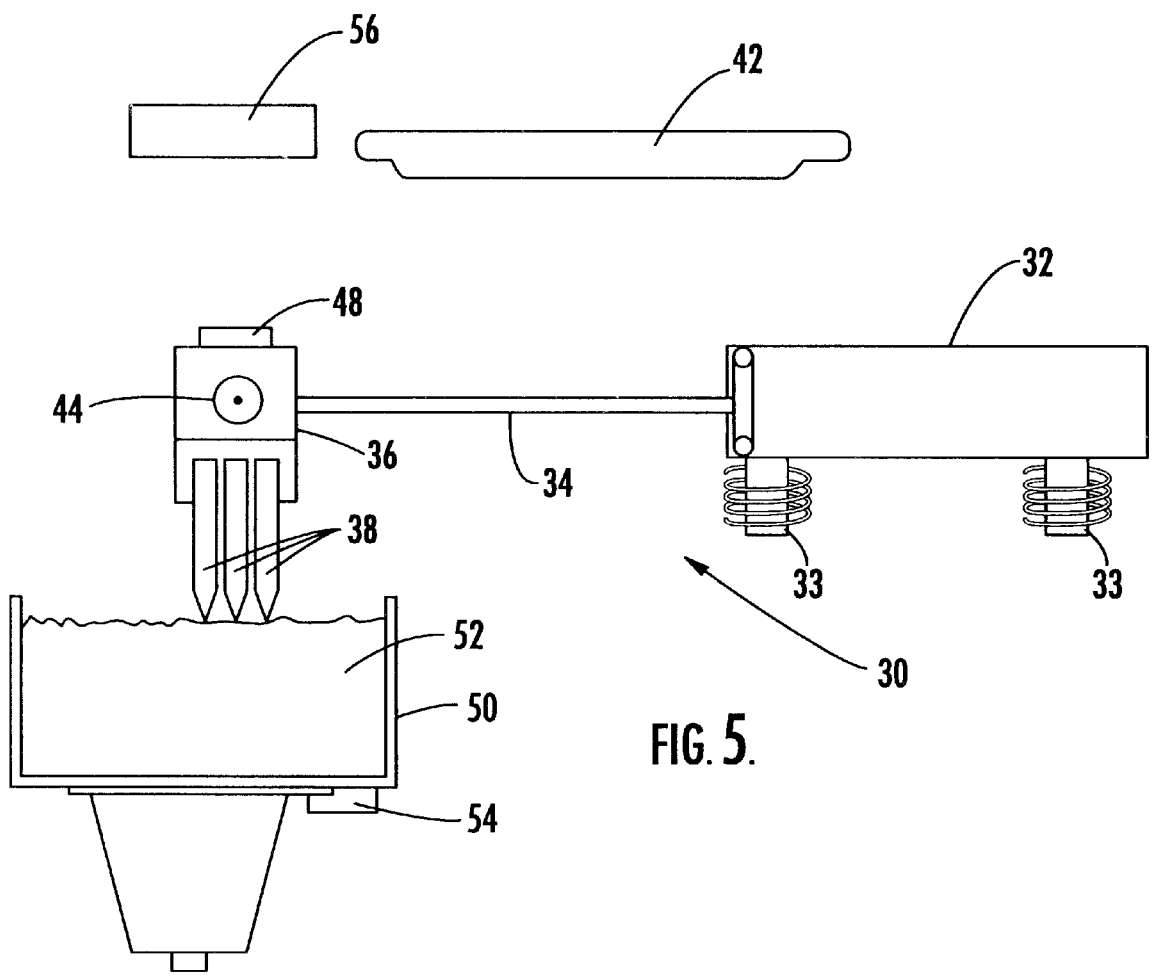
FIG. 5 is a side elevational view of the stencil wiping device of FIG. 3 with blades positioned over the cleaning bath.

After one wiping cycle has been completed and the stencil 42 is satisfactorily cleaned, the solder paste 40 must be removed from the blades 38. The blades 38 must be cleaned in preparation for a new stencil wiping cycle. If the blades 38 are not clean, solder paste 40 will accumulate on the blades 38 thus having a deleterious effect on the ability of the blades 38 to effectively clean the stencil 42. The blades 38 must be cleaned after each cycle to avoid redepositing the wiped solder paste 40 back on the bottom side of the stencil 42 from which it was just removed. FIG. 4 illustrates the movement of the blades 38 from a wiping position below the stencil 42 to a position above a container 50 with cleaning solution 52 therein. The blades 38 are moved by actuating the piston rod 34 toward the left to thereby move the blade holder 36 over the container 50. Simultaneously or in discrete steps, the blade holder 36 is also rotated counter-clockwise as indicated by the arrows. As shown in FIG. 5, the blade holder 36 is rotated approximately 180 degrees from the wiping position so that the blades 38 face in a downward direction.

As shown in FIG. 6, the cylinder 32 and actuated in a downward direction, via up/down pistons 33, thus immersing the blades 38, via the piston rod 34 and blade holder 36, into the cleaning solution 52 in a container 50. The cleaning solution 52 is, preferably a liquid mixture of alcohol and water, or other suitable cleaning agents, to assist in the removal of solder paste 40, but other cleaning solutions may be employed depending on the type of solder paste 40 and the application at hand. Two to eight ultrasonic transducers 54 are preferably mounted to the container 50 to generate ultrasonic waves in the cleaning solution 52 to further assist in mechanically removing and dislodging contaminant particles, such as collected solder paste 40, from the blades 38. As a result, the dislodged material may be easily reclaimed from the cleaning solution 52 using known separation techniques. It has been found that ultrasonic cleaning in the cleaning solution 52 for approximately 5 to 10 seconds is sufficient for removal of most solder pastes 40 from the wiping blades 38. However, the type of solder paste 40, size, configuration, material and number of blades 38 may require more or less ultrasonic cleaning.

While the use of ultrasonic waves to further assist in dislodging particles from the blades 38, this additional assistance is the key to successful cleaning. Further other mechanical and chemical methods may be employed to improve cleaning of the wiping blades 38. For example, the vibratory mechanism 48 connected to the blade holder 36 may be also be activated during ultrasonic cleaning to improve removal of the solder paste 40 from the blades 38.

After the blades 38 have been cleaned in the cleaning solution 52, they may be rotated and translated directly back into the wiping position as shown in FIG. 3 for a new cycle of stencil cleaning. However, it is preferred that the cleaning solution 52 be removed from the blades 38 so that they are relatively dry prior to further wiping to, ensure proper function of the blades 38 on the bottom surface 46 of the stencil 42. As shown in FIG. 7, a mounted sponge 56 is preferably employed to assist in the removal of excess cleaning solution 52 left remaining on the blades 38 after they have been ultrasonically cleaned. The sponge 56 is preferably mounted above the container 50 containing the cleaning solution 52. The sponge 56 may be natural or synthetic and is chemically compatible with the cleaning solution 52 to be removed from the blades 38. The blades 38 are rotated clockwise out of the cleaning solution 52 and are raised into the sponge 56 by vertically moving the cylinder 32 as indicated by the reference arrows. The blades 38 may be pulsed into the sponge 56, via up/down pistons 33, to embed the blades 38 multiple times to ensure as much cleaning solution 52 is reduced as possible. After the excess cleaning solution 52 is mostly removed from the blades 38, the blades 38 are translated to a position below the stencil 42, as shown in FIG. 3, to begin a new wiping cycle in accordance with the present invention.

Figure 8:
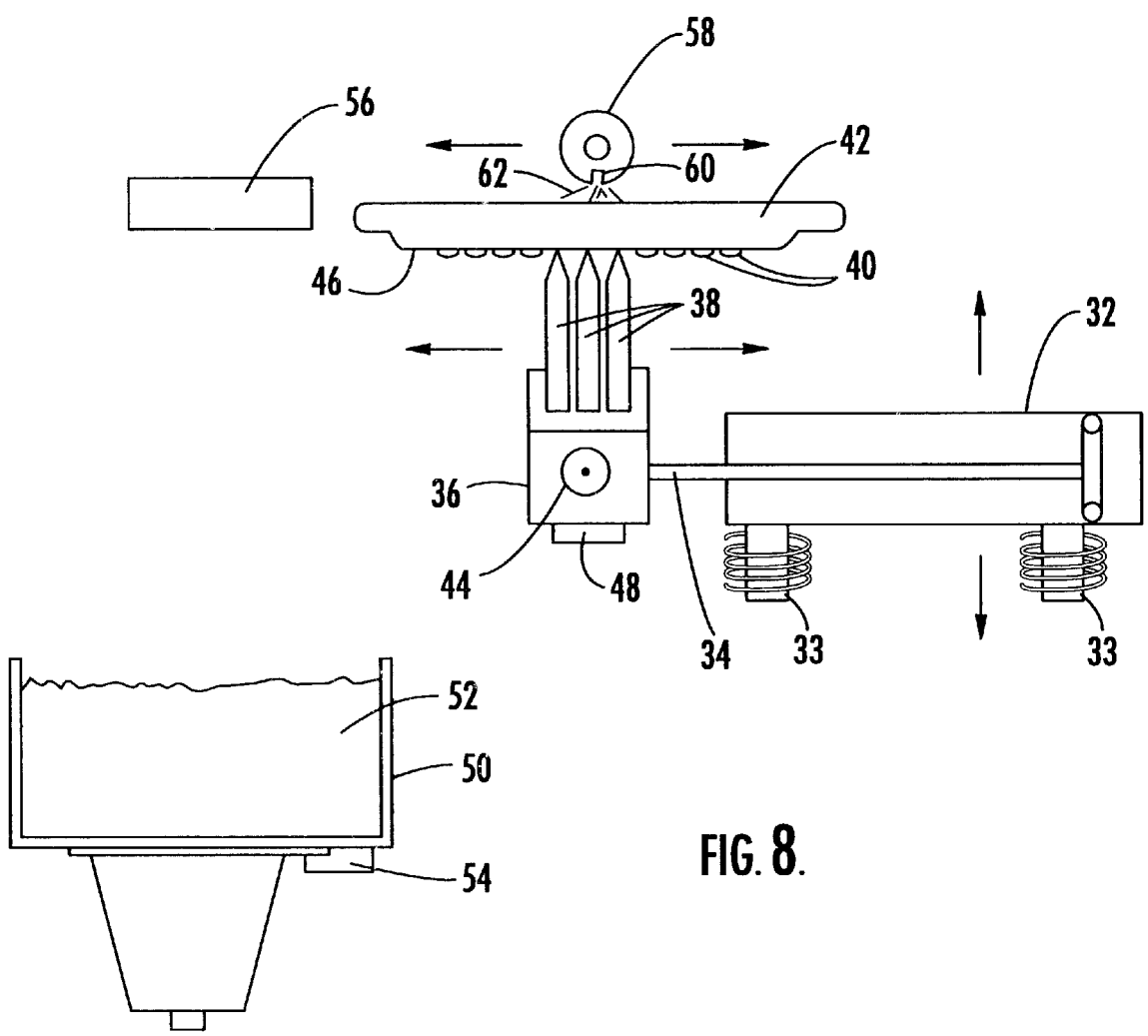
FIG. 8 is a side elevational view of an alternative embodiment of the stencil wiping device of FIG. 3 with optional air blower.

As shown in FIG. 8, an air blower 58 may optionally be further employed to improve the overall cleaning ability of the stencil wiping device 30 of the present invention. FIG. 8 shows a side elevational view of a air blower tube 58 with a number of apertures 60 therein. The tube 58 is connected to an air source (not shown), such as an air compressor, at a pressure of, for example, 80–100 psi. The tube 58, preferably made of metal with a series of apertures 60 along its length, is mounted above the stencil 42 to be cleaned and tracks over the stencil 42 in synchronization with the,wiping blades 38 positioned below the stencil 42. The air blower tube 58 forces air 62 in a downward direction through the stencil 42 toward the blades 38 to urge solder paste 40 and flux to be forced therethrough. As a result, the blades 38 are more effective in wiping clean the bottom surface 46 of the stencil 42.

It would be appreciated by those skilled in the art that various changes and modifications can be made to the illustrated embodiments without departing from the spirit of the present invention. All such modifications and changes are intended to be covered by the appended claims.

What is claimed is:

1. A cleaning apparatus for cleaning solder paste off of the bottom side of a stencil, comprising:
   a container having a volume of ultrasonically activated cleaning solution therein;
   a blade holder; said blade holder being movable between a wiping position and said container;
   a blade mounted in said blade holder;
   means for reciprocatably moving said blade holder, with said blade mounted thereon, when in said wiping position;
   means for moving said blade from said wiping position into said cleaning solution in said container; and
   means for moving said blade from said cleaning solution to said wiping position.

2. The cleaning apparatus of claim 1, further comprising: means for vibrating said blade in a zig zag motion.

3. The cleaning apparatus of claim 1, further comprising: means for ultrasonically vibrating said cleaning solution.

4. The cleaning apparatus of claim 1, further comprising: an air blower positioned proximal to said blade.

5. The cleaning apparatus of claim 1, further comprising: wherein said means for reciprocatably moving said blade holder is a pneumatic piston.

6. The cleaning apparatus of claim 1, further comprising: wherein said means for reciprocatably moving said blade holder is a hydraulic piston.

7. The cleaning apparatus of claim 1, wherein said means for moving said blade holder from said wiping position to said cleaning position is a pneumatic piston and a rotary actuator.

8. The cleaning apparatus of claim 1, further comprising: a plurality of blades installed in said blade holder.

9. The cleaning apparatus of claim 1, wherein said at least one blade is manufactured of rubber.

10. The cleaning apparatus of claim 1, wherein said at least one blade is manufactured of plastic.

11. The cleaning apparatus of claim 1, further comprising: means for removing said cleaning solution from said at least one blade.

12. The cleaning apparatus of claim 11, wherein said means for removing said cleaning solution is a sponge.

13. A cleaning apparatus for cleaning solder paste off of the bottom side of a stencil, comprising:
    a container having a volume of recirculating cleaning solution therein;
    a blade holder; said blade holder being movable between a wiping position and said container; at least one blade mounted in said blade holder;
    a pneumatic piston connected to said blade holder; said blade holder and said at least one blade installed therein being reciprocatable along a first axis by said pneumatic piston; said pneumatic piston reciprocatably moving said blade holder and said at least one blade installed therein when said blade holder is in said wiping position;
    a rotary actuator connected to said blade holder; said blade holder and said blade installed therein being rotatable about a second axis substantially perpendicular to said first axis by said rotary actuator; said rotary actuator rotating said blade holder with said at least one blade installed therein about said second axis into communication with said containers;
    means for submerging said at least one blade into said cleaning solution in said container;
    means for moving said at least one blade from said cleaning solution to said wiping position.

14. The cleaning apparatus of claim 13, further comprising:
    means for vibrating said at least one blade connected to said blade holder.

15. The cleaning apparatus of claim 13, further comprising:
    means for vibrating said container connected to said container.

16. The cleaning apparatus of claim 13, further comprising:
    an air blower connected to said at least one blade.

17. The cleaning apparatus of claim 13, further comprising:
    a sponge positioned proximal to said container; said sponge being capable of receiving said at least one blade.

* * * * *